(12) United States Patent
Yang et al.

(10) Patent No.: US 6,763,503 B1
(45) Date of Patent: Jul. 13, 2004

(54) ACCURATE WIRE LOAD MODEL

(75) Inventors: Xiao-Dong Yang, Sunnyvale, CA (US); Devendra Vidhani, Sunnyvale, CA (US); Georgios Konstadinidis, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 16 days.

(21) Appl. No.: 09/989,597

(22) Filed: Nov. 20, 2001

(51) Int. Cl.$^7$ .......................... G06F 17/50; G06F 9/45
(52) U.S. Cl. .................... 716/4; 716/5; 716/10
(58) Field of Search ................... 716/10, 11, 4, 716/5, 6, 1, 2, 3, 18; 713/135.4; 703/2, 13

(56) References Cited

U.S. PATENT DOCUMENTS

| | | | | |
|---|---|---|---|---|
| 5,610,833 A | * | 3/1997 | Chang et al. ............... | 716/11 |
| 5,629,860 A | * | 5/1997 | Jones et al. ................ | 716/6 |
| 5,694,344 A | * | 12/1997 | Yip et al. .................. | 703/2 |
| 5,706,206 A | * | 1/1998 | Hammer et al. ............. | 716/4 |
| 6,175,947 B1 | * | 1/2001 | Ponnapalli et al. ......... | 716/5 |
| 6,189,131 B1 | * | 2/2001 | Graef et al. ................ | 716/8 |
| 6,243,653 B1 | * | 6/2001 | Findley ..................... | 702/65 |
| 6,291,254 B1 | * | 9/2001 | Chou et al. ................ | 438/18 |
| 6,381,730 B1 | * | 4/2002 | Chang et al. ............... | 716/5 |

OTHER PUBLICATIONS

"A Set of Analytic Formulas for Capacitance of VLSI Interconnects of Trapezium Shape," by Ganesh Shankar Samudra and Hsio Lin Lee; IEEE Transactions on Electron Devices, vol. 41, No. 8, Aug. 1994; (4 pages).

"Inductance and Capacitance Analytic Formulas for VLSI Interconnects," by N. Delorme, M. Belleville and J. Chilo; Electronics Letter, vol. 32, No. 11, May 23, 1996; (4 pages).

"Closed–Form Expression for Interconnection Delay, Coupling and Crosstalk in VLSI's," by Takayasu Sakurai; IEEE Transactions on Electron Devices, vol. 40., No. 1, Jan. 1993; (8 pages).

"Multilevel Metal Capacitance Models for CAD Design Synthesis Systems," by Jue–Hsien Chern, Jean Huang, Lawrence Arledge, Ping–Chung Li and Ping Yang; IEEE Electron Device Letters, vol. 13, No. 1, Jan. 1992; (4 pages).

* cited by examiner

*Primary Examiner*—Leigh M. Garbowski
(74) *Attorney, Agent, or Firm*—Osha & May L.L.P.

(57) ABSTRACT

A method for creating a wire load model using specific interconnect configuration information is provided. Further, a program that creates a wire load model by curve-interconnect fitting parasitic information and interconnect configuration information is provided. Further, a computer system capable of creating an accurate wire load model using parasitic information specific to particular metal layers is provided.

20 Claims, 3 Drawing Sheets

ACCURATE WIRE LOAD MODEL

BACKGROUND OF INVENTION

A typical integrated circuit contains millions of electrical components such as transistors, resistors, capacitors, diodes, and their associated interconnections, which are usually made through conductive materials made of deposited metal, polysilicon, and the like. An integrated circuit's components and their interconnections are typically arranged in a plurality of metal layers which are formed over a substrate typically formed by a silicon wafer. Each layer can contain several thousand conductors. Such conductors are typically electrically insulated from one another by a non-conducting material or dielectric material such as borophosilicate glass, silicon dioxide, and the like.

FIG. 1 shows a section of a typical semiconductor wafer (10) having a substrate (12) and a plurality of conductors (14, 16, 18, 20). The conductors (14, 16, 18, 20) are separated from one another and insulated by dielectric material layers (22, 24). The vertical and lateral spacing of the conductors (14, 16, 18, 20) can lead to a phenomenon known as "parasitic capacitance." Capacitance is a natural phenomenon that exists between any two conductors that are not electrically connected to each other; the shorter the distance between two conductors, the larger the capacitance. Parasitic capacitance is termed as such because it is an undesirable effect resulting from the close proximity of conductors in an integrated circuit.

In FIG. 2, exemplary parasitic capacitances are schematically shown as capacitor elements that are joined between the conductors (14, 16, 18, 20), where the conductors (14, 16, 18, 20) are shown for clarity without dielectric material layer boundaries. To calculate, or otherwise determine, the parasitic capacitance attributed to an integrated circuit conductor, the parasitic capacitance can be broken down into components, as modeled in FIG. 2. Particularly, three different components of parasitic capacitance are shown: area capacitance ($C_a$), a coupling or lateral capacitance ($C_c$), and a fringing or fringe capacitance ($C_f$).

The area capacitance, $C_a$, is the component of parasitic capacitance that exists between the top and bottom surface of two overlapping conductors. Accordingly, portions of the top surface of conductor (14) are overlapped by portions of the bottom surface of conductor (16). Hence, parasitic area capacitance can develop therebetween.

Lateral coupling capacitance, $C_c$, is the component of parasitic capacitance that exists between adjacent lateral edges of two conductors. Accordingly, the adjacent lateral edges of conductors (16, 18) can give rise to the shown coupling capacitance.

Fringe capacitance, $C_f$, also known as "edge capacitance," is the component of parasitic capacitance that exists between a lateral edge of a first conductor and either the top or bottom surface of a second conductor that overlaps, or underlaps, the lateral edge of the first conductor. Accordingly, the leftmost side edge of conductor (16) and the top of conductor (14) can give rise to a fringe capacitance. The fringe capacitance is essentially a distortion to the area capacitance component causes by fringing effects at a conductor's lateral edges. Similarly, as shown in FIG. 2, there are area and fringe components of capacitance between metals and the semiconductor substrate (12).

An undesirable effect of parasitic capacitance is to slow the propagation of electrical signals through a circuit, thereby reducing the speed at which an integrated circuit can operate. The larger the parasitic capacitance, the greater the delay a signal will encounter as it travels through a conductor. If the components of parasitic capacitance can be extracted from an integrated circuit from the integrated circuit's physical design, such components can be used to estimate the delay for signals in the integrated circuit through a process known as "timing and noise analysis." This information can then be used to adjust the physical layout of the conductors in an integrated circuit, thereby improving the performance of an integrated circuit.

Typically, within the integrated circuit industry, there are a number of extraction tools, e.g., layout parasitic extractors, that are designed to enable circuit designers to extract and analyze parasitic capacitances. Often, because such parasitic extraction is performed during an early circuit design stage that is prior to the actual layout of the integrated circuit, designers rely on "wire load models" in order to conduct their timing and noise analyses. Thus, due to the earliness of the parasitic extraction stage in the design cycle, the layout of the circuit is typically not yet available, and therefore, designers use general topological structures, such as the one shown in FIG. 1, for timing and noise analyses.

In conventional wire load models, capacitance is a function of wire width, spacing, layer thickness, and interlayer thickness. Such models use general formulas that conform to normal circuit conditions. However, these formulas tend to yield inaccurate findings with reference to real applications because the formulas are formed by consideration of certain layers when certain conditions are true. Further, conventional wire load models may not account for the different kinds of dielectric materials that are used in semiconductor technologies. In other words, previous models are not generic enough for all metal configurations because they are based on relatively simple geometric configurations. Moreover, such models are heavily dependent on technology and have to be redesigned/remodeled as technology changes.

SUMMARY OF INVENTION

According to one aspect of the present invention, a method for creating a wire load model comprises creating an interconnect configuration, running a field solver to generate parasitic information for the interconnect configuration, storing the parasitic information in an accessible format, and running a curve-fitting engine to create the wire load model, where running the curve-fitting engine is dependent on the parasitic information.

According to another aspect, a program storage device readable by a machine that tangibly embodies a program of instructions executable by the machine to perform a method for creating a wire load model comprises creating a wire structure, running a field solver to generate parasitic information for the wire structure, storing the parasitic information in an accessible format, and running a curve-fitting engine to create the wire load model, where running the curve-fitting engine is dependent on the parasitic information.

According to another aspect, a computer system comprises a memory for storing a model of a circuit, a processor for creating a wire load model (where the processor establishes an interconnect configuration for the circuit), a field solver for determining parasitic information for the interconnect configuration, and a curve-fitting engine that uses the parasitic information to generate the wire load model.

According to another aspect, a method for creating a wire load model comprises creating an interconnect configuration, generating parasitic information for the interconnect configuration, storing the parasitic information in an accessible format, and creating the wire load model dependent on the parasitic information.

According to another aspect, a wire load model creation tool comprises means for creating an interconnection configuration for a structure, means for field solving the interconnect configuration to determine parasitic information, means for storing the parasitic information, curve-fitting means for curve-fitting the parasitic information and using interconnect configuration parameters to create a wire load model, and means for controlling error in the curve-fitting means.

Other aspects and advantages of the invention will be apparent from the following description and the appended claims.

DETAILED DESCRIPTION

Embodiments of the present invention relate to a method for creating an accurate wire load model. Embodiments of the present invention further relate to an apparatus for creating an accurate wire load model. Embodiments of the present invention further relate to a method for generating one or more wire load models that are created differently for different wire structures. Embodiments of the present invention further relate to an apparatus that generates one or more wire load models that are created differently for different wire structures. Embodiments of the present invention further relate to a method and apparatus for generating one or more wire load models using a curve-fitting engine having an error control mechanism.

Figure 1:
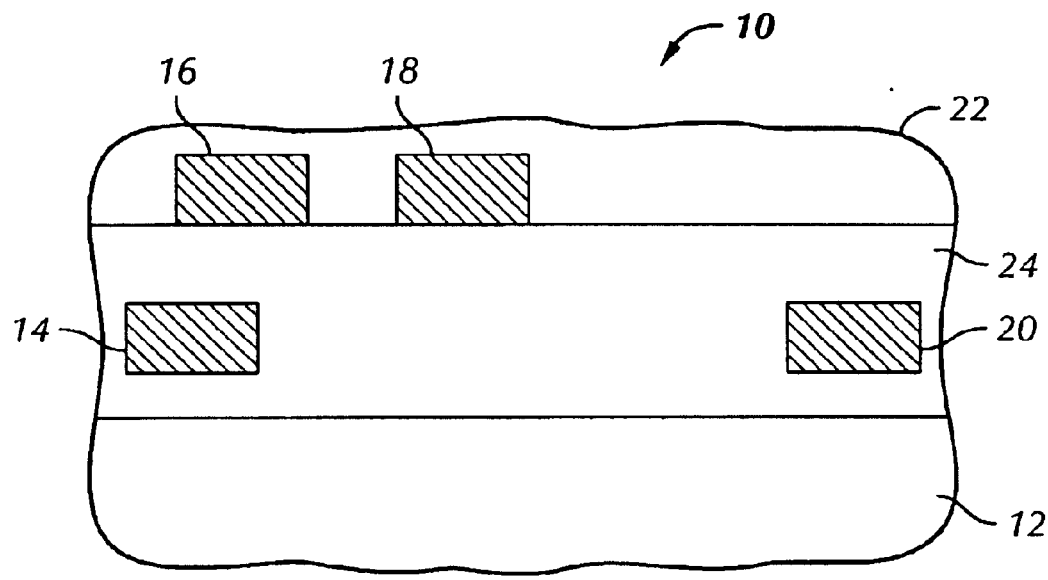
FIG. 1 shows a section of a typical semiconductor wafer.
Figure 2:
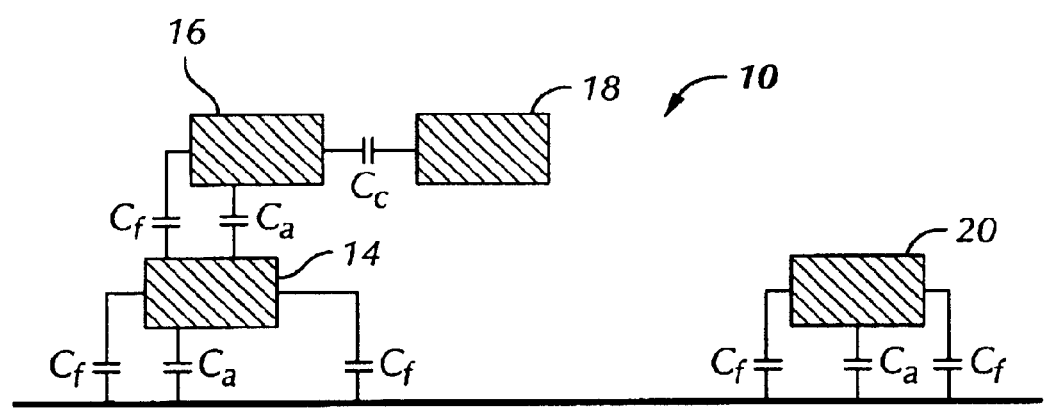
FIG. 2 shows exemplary parasitic capacitances in a typical semiconductor wafer.
Figure 3:
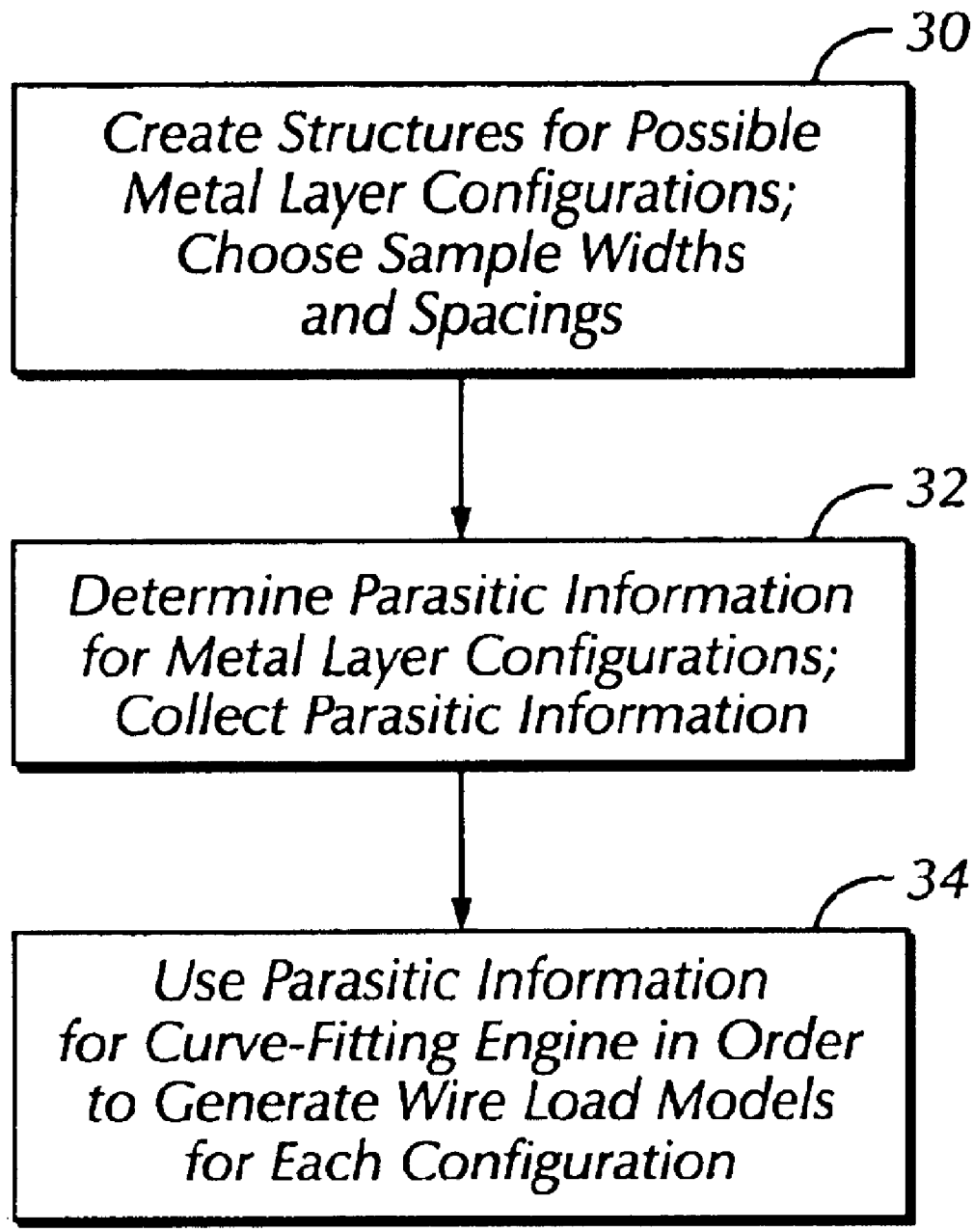
FIG. 3 shows a flow process in accordance with an embodiment of the present invention.

FIG. 3 shows an exemplary flow process in accordance with an embodiment of the present invention. Specifically, FIG. 3 illustrates flow process by which one or more accurate wire load models may be generated for different interconnect configurations. Initially, structures are created for all possible metal layer combinations (step 30). In this step, sample widths and spacings for the individual metal layers are chosen, where the sample width and spacing of a particular metal layer may be 1, 2, 4, 8, 16, and 32 times a minimum width and spacing specification for that particular metal layer (step 30). Those skilled in the art will appreciate that other embodiments may use a number other than the ones listed above for choosing a sample width and spacing for a particular metal layer.

For the interconnect configurations created above, a field solver is used to determine parasitic resistance and capacitance numbers, where the numbers are collected in an easily accessible format (step 32) such as a look up table. Those skilled in the art will appreciate that other formats may also be used.

Then, using the collected information of parasitic resistances and capacitances, a curve-fitting engine, or other similar engine, is used to generate accurate wire load models according to Equations (1)–(4) given below (step 34).

$$C_g = C_a + C_f \quad (1)$$

$$C_f = C_{f0} \times (1 - k_1 \times e^{-k_2 S}) \quad (2)$$

$$C_a = W \times C_{a0} \times \frac{S}{S + S_a} \quad (3)$$

$$C_c = C_{c0} \times \left(1 + C_{c1} \times \frac{W}{W + W_c}\right) \times e^{-C_{c2} \times (S - S_0)} \times \left(\frac{S_0}{S}\right)^{(C_{c2} + C_{c3} \times W)} \quad (4)$$

where $C_g$ represents ground capacitance, $C_a$ represents area capacitance, $C_f$ represents fringe capacitance, $C_{f0}$ represents a first order value of finge capacitance, $k_1$ represents a first coefficient, $k_2$ represents a second coefficient, W represents a width; $C_{a0}$ represents a first order area capacitance, S represents a spacing, $S_a$ represents an area capacitance spacing, $C_{c0}$ represents a first order coupling or lateral capacitance, $C_{c0}$ represents a second order coupling or lateral capacitance, $W_c$ represents a lateral capacitance width, $C_{c2}$ represents a third order coupling or lateral capacitance, $S_0$ represents a first order spacing, and $C_{c3}$ represents a fourth order coupling or lateral capacitance. The coefficients used in Equations (1)–(4) are different for different structures. Further, those skilled in the art will appreciate that in other embodiments, similar formulations or derivations of Equations (1)–(4) may be used.

Those skilled in the art will appreciate that Equations (1)–(4) are so developed as to allow the curve-fitting engine to have error control. In other words, the curve-fitting engine also has an error control mechanism by which an error bound may be specified for a particular curve-fitting. Via Equations (1)–(4), the curve-fitting engine allows one to control error by specifying the amount of error that can be tolerated.

As stated above, once parasitic information is collected (step 32), a non-linear curve-fitting engine, according to Equations (1)–(4), creates one or more wire load models, where the one or more wire load models are created based on the values used in Equations (1)–(4).

Those skilled in the art will appreciate that a wire load model library may be created using the wire load model data for interconnect configurations generated by the flow process discussed with reference to FIG. 3. One or more such libraries may be then used by circuit simulation engines, noise and timing analysis engines, etc.

Figure 4A:
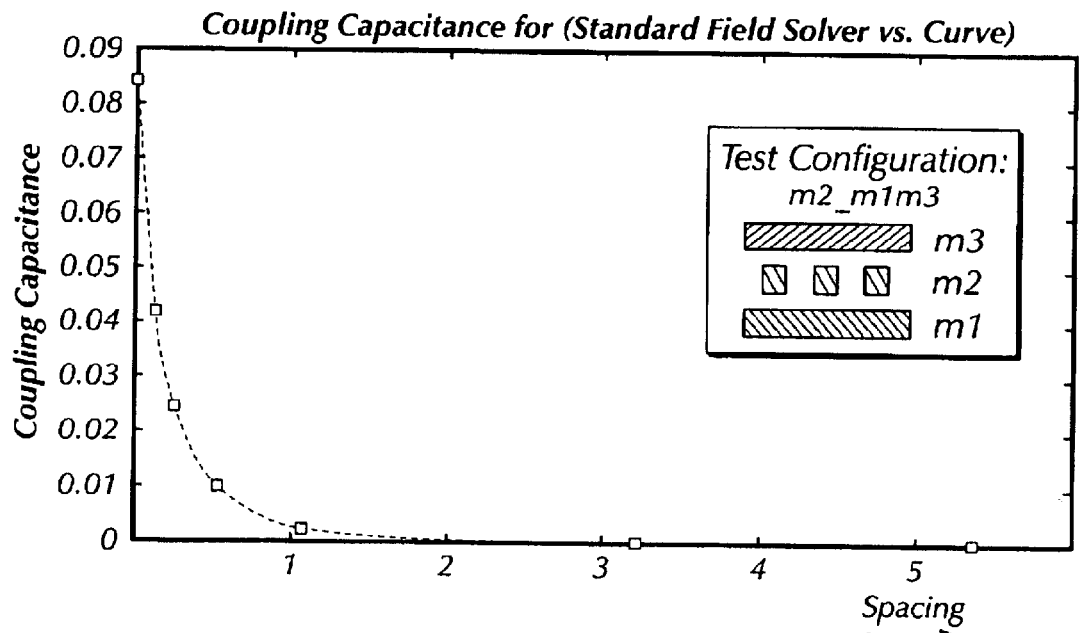
FIG. 4a shows a graphical relationship in accordance with an embodiment of the present invention.
Figure 4B:
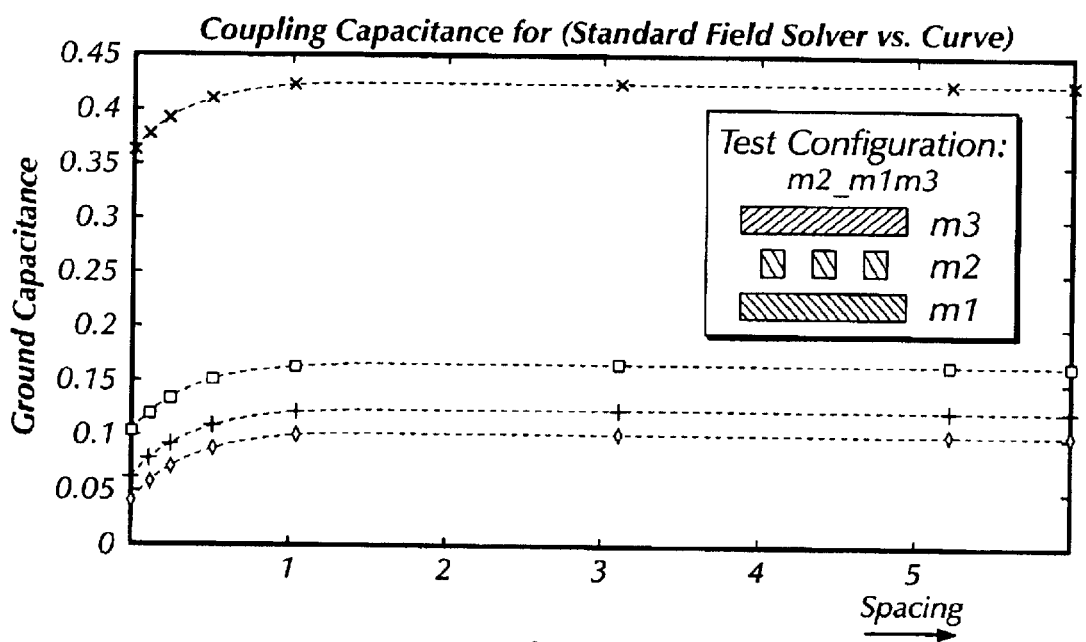
FIG. 4b shows a graphical relationship in accordance with an embodiment of the present invention.

FIG. 4a shows an exemplary relationship between ground capacitance and layer width generated by the technique discussed above with reference to FIG. 3. Further, FIG. 4b shows an exemplary relationship between coupling capacitance and layer width generated by the technique discussed above with reference to FIG. 3. Further, FIGS. 4a and 4b show the relationships with reference to a standard field solver.

Advantages of the present invention may include one or more of the following. In some embodiments, because a technique to create one or more wire load models uses information specific to individual wire configurations, the one or more wire load models are accurate for all metal layers.

In some embodiments, because a creation of a wire load model depends on parameters and variables specific to a particular wire structure, the wire load model is flexible in that it can be modified/adjusted for different wire structure conditions.

In some embodiments, because a creation of a wire load model accounts for dielectric properties affecting a wire, conditions pertaining to various semiconductor technologies may be accounted for in the creation of the wire load model.

In some embodiments, because a creation of a wire load model accounts for dielectric properties affecting a wire, conditions pertaining to dielectric parameters, e.g., dielectric widths, dielectric constants, etc., may be controlled in the creation of the wire load model.

In some embodiments, because a creation of a wire load model accounts for a plurality of properties affecting a wire, conditions pertaining to one or metal layers may be accounted for in the creation of the wire load model.

In some embodiments, because a curve-fitting engine that generates a wire load model accounts for a plurality of properties affecting a wire, one may account for metal layers above and/or below the wire.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for creating a wire load model, comprising:
    creating an interconnect configuration
    running a field solver to generate parasitic information for the interconnect configuration;
    storing the parasitic information in an accessible format, wherein the parasitic information comprises capacitance and resistance information;
    selecting an error bound for a curve-fitting engine; and
    running the curve-fitting engine to create the wire load model, wherein running the curve-fitting engine is dependent on the parasitic information.

2. The method of claim 1, wherein a range of widths and spacings for the interconnect configuration are chosen so that widths and spacings are larger than a minimum width and spacing specification for the interconnect configuration.

3. The method of claim 2, wherein the accessible format is a look-up table for the range.

4. The method of claim 1, wherein the curve-fitting engine is a non-linear curve-fitting engine.

5. The method of claim 1, wherein the parasitic information comprises at least one selected from the group consisting of an area capacitance, a coupling capacitance, and a fringe capacitance.

6. A program storage device readable by a machine, tangibly embodying a program of instructions executable by the machine to perform a method for creating a wire load model, the method comprising:
    creating a wire structure;
    running a field solver to generate parasitic information for the wire structure, wherein the parasitic information comprises capacitance and resistance information;
    storing the parasitic information in an accessible format;
    selecting an error bound for a curve-fitting engine; and
    running the curve-fitting engine to create the wire load model, wherein running the curve-fitting engine is dependent on the parasitic information.

7. The method of claim 6, wherein a width and a spacing for the wire structure is chosen so that the width and spacing is larger than a minimum width and spacing specification for the wire structure.

8. The method of claim 6, wherein the accessible format is a look-up table.

9. The method of claim 6, wherein the curve-fitting engine is a non-linear curve-fitting engine with an error control mechanism.

10. The method of claim 6, wherein the parasitic information comprises at least one selected from the group consisting of an area capacitance, a coupling capacitance, and a fringe capacitance.

11. A computer system, comprising:
    a memory for storing a model of a circuit;
    a processor for creating a wire load model, wherein the processor establishes an interconnect configuration for the circuit;
    a field solver for determining parasitic information for the interconnect configuration, wherein the parasitic information comprises capacitance and resistance information; and
    a curve-fitting engine, adjustable by selection of an error bound, that uses the parasitic information to generate the wire load model.

12. The computer system of claim 11, wherein a width and a spacing for the interconnect configuration is chosen so that the width and spacing is larger than a minimum width and spacing specification for the interconnect configuration.

13. The computer system of claim 11, wherein the curve-fitting engine is a non-linear curve-fitting engine.

14. The computer system of claim 11, wherein the parasitic information comprises at least one selected from the group consisting of an area capacitance, a coupling capacitance, and a fringe capacitance.

15. A method for creating a wire load model, comprising:
    creating an interconnect configuration;
    generating parasitic information for the interconnect configuration, wherein the parasitic information comprises capacitance and resistance information;
    storing the parasitic information in an accessible format; and
    creating the wire load model dependent on the parasitic information, wherein the creating comprises selecting an error bound for curve-fitting process.

16. The method of claim 15, wherein generating parasitic information uses a field solver.

17. The method of claim 15, wherein creating the wire load model uses a non-linear curve-fitting engine.

18. The method of claim 15, wherein the parasitic information comprises at least one selected from the group consisting of an area capacitance, a coupling capacitance, and a fringe capacitance.

19. A wire load model creation tool, comprising:
    means for creating an interconnection configuration for a structure;
    means for field solving the interconnect configuration to determine parasitic information, wherein the parasitic information comprises capacitance and resistance information;
    means for storing the parasitic information;
    curve-fitting means for curve-fitting the parasitic information and using interconnect configuration parameters to create a wire load model; and
    means for controlling error in the curve-fitting means.

20. The method of claim 1, wherein the interconnect configuration is non-symmetrical.

* * * * *